United States Patent

Muthu et al.

(10) Patent No.: US 10,687,444 B2
(45) Date of Patent: Jun. 16, 2020

(54) THERMAL MANAGEMENT DEVICE

(71) Applicant: ROLLS-ROYCE PLC, Landon (GB)

(72) Inventors: Vivek Muthu, Singapore (SG); Chandana J Gajanayake, Singapore (SG); Pradip Chatterjee, Singapore (SG)

(73) Assignee: ROLLS-ROYCE plc, London (GB)

( * ) Notice: Subject to any disclaimer, the term of this patent is extended or adjusted under 35 U.S.C. 154(b) by 0 days.

(21) Appl. No.: 16/197,775

(22) Filed: Nov. 21, 2018

(65) Prior Publication Data

US 2019/0182991 A1 Jun. 13, 2019

(30) Foreign Application Priority Data

Dec. 12, 2017 (GB) .................................. 17206667.3

(51) Int. Cl.
*H05K 7/20* (2006.01)
*H01L 23/473* (2006.01)
(Continued)

(52) U.S. Cl.
CPC ......... *H05K 7/20927* (2013.01); *B64D 37/30* (2013.01); *B64D 47/00* (2013.01);
(Continued)

(58) Field of Classification Search
CPC ........... H05K 7/20927; H05K 7/20336; H05K 7/20445; H05K 7/20254; H05K 7/2039;
(Continued)

(56) References Cited

U.S. PATENT DOCUMENTS 1,611,299 A * 12/1926 Wilka ...................... F02M 1/00
48/189.2
3,913,703 A * 10/1975 Parker ...................... F01N 1/06
181/206
(Continued)

FOREIGN PATENT DOCUMENTS

EP 2672512 A2 12/2013
GB 1532369 A 11/1978
(Continued)

OTHER PUBLICATIONS

Aoyama, Cooler, Translation of JP 2017069518, Apr. 2017 (Year: 2017).*

(Continued)

*Primary Examiner* — Daniel P Wicklund
*Assistant Examiner* — Amir A Jalali
(74) *Attorney, Agent, or Firm* — Oliff PLC

(57) ABSTRACT

A thermal management device for dissipating heat from one or more electrical components in an aircraft, the thermal management device including: a heat spreader with a plurality of layers of annealed pyrolytic graphite, the heat spreader having higher thermal conductivity in a plane defined by the layers than in a direction perpendicular to the layers; a flow path for a cooling fluid defined through the heat spreader, such that at least a portion of the flow path is surrounded by the heat spreader, wherein the flow path is helical, around a central axis extending through the plurality of layers; and a housing encasing the heat spreader, the housing arranged to have one or more electrical components mounted there-on and to form a thermal interface between the heat spreader and one or more electrical components.

17 Claims, 5 Drawing Sheets

(51) Int. Cl.
 *H01L 23/373* (2006.01)
 *B64D 37/30* (2006.01)
 *B64D 47/00* (2006.01)
(52) U.S. Cl.
 CPC .......... *H01L 23/373* (2013.01); *H01L 23/473* (2013.01); *H05K 7/209* (2013.01); *H05K 7/20272* (2013.01); *H05K 7/20854* (2013.01); *H05K 7/20872* (2013.01)
(58) Field of Classification Search
 CPC .......... H05K 7/20636; H05K 7/20645; H05K 7/20709; H05K 7/20772; H05K 7/20781; H05K 7/20854; H05K 7/20809; H05K 1/028; H05K 5/0017; H05K 5/03; H05K 7/20818; H05K 7/209; G06F 2200/201; G06F 1/20; H01L 23/373; H01L 23/473; B64D 7/00
 USPC ...... 361/772, 679.52–679.54, 721, 832, 702, 361/704, 670.46, 699
 See application file for complete search history.

(56) References Cited

U.S. PATENT DOCUMENTS

| | | | | | |
|---|---|---|---|---|---|
| 4,161,980 | A | * | 7/1979 | Ruger | H01L 23/473 165/168 |
| 5,692,558 | A | * | 12/1997 | Hamilton | F28F 13/00 165/104.33 |
| 9,897,347 | B2 | * | 2/2018 | Breidenbach | E21B 7/205 |
| 2007/0158050 | A1 | * | 7/2007 | Norley | H01L 23/473 165/80.4 |
| 2008/0210402 | A1 | * | 9/2008 | Kidwell | F28D 7/026 165/45 |
| 2009/0284923 | A1 | * | 11/2009 | Rytka | H05K 7/20927 361/700 |
| 2013/0280470 | A1 | | 10/2013 | Norly | |
| 2015/0090434 | A1 | * | 4/2015 | Lemak | H01L 23/3733 165/185 |
| 2015/0096719 | A1 | * | 4/2015 | Moskaitis | H05K 7/20254 165/80.4 |
| 2018/0177072 | A1 | * | 6/2018 | Pando Rodriguez | H01L 23/373 |
| 2018/0366391 | A1 | * | 12/2018 | Waddell | H01L 23/473 |
| 2019/0098743 | A1 | * | 3/2019 | Molla | H01L 23/3677 |
| 2019/0116657 | A1 | * | 4/2019 | Fuller | H05K 1/0346 |
| 2019/0139862 | A1 | * | 5/2019 | Chang | H01L 23/473 |
| 2019/0297744 | A1 | * | 9/2019 | Gernert | H05K 7/20336 |

FOREIGN PATENT DOCUMENTS

| | | | |
|---|---|---|---|
| JP | 2017-069518 A | | 4/2017 |
| JP | 2017069518 A | * | 4/2017 |
| KR | 101620106 B1 | * | 5/2016 |
| WO | 2015/184555 A1 | | 12/2015 |

OTHER PUBLICATIONS

Sung, Double-Piped Heat Exchanger, Translation of KR 101620106, May 2016 (Year: 2016).*

Apr. 24, 2018 Search Report issued in British Patent Application No. 1720667.3.

Apr. 11, 2019 Search Report issued in European Patent Application No. 18207346.

* cited by examiner

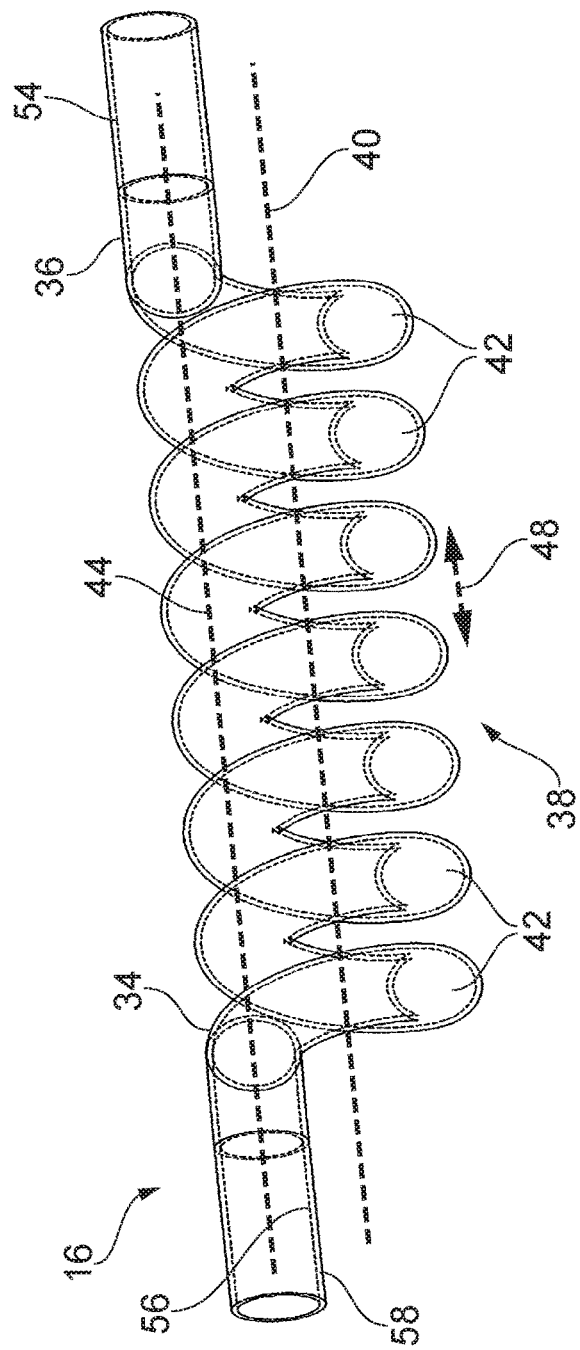
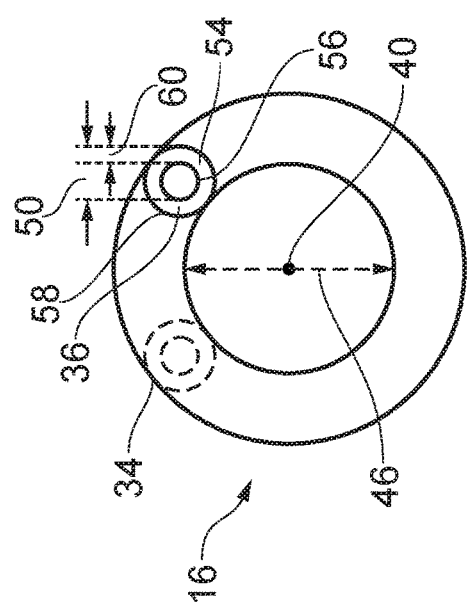
FIG. 2A
FIG. 2B

THERMAL MANAGEMENT DEVICE

The present disclosure concerns a thermal management device, and a power converter incorporating the thermal management device. In particular, but not exclusively, the thermal management device and power converter may be for use in an aircraft that uses electrical power for non-propulsive systems.

Increasingly, non-propulsive systems on aircraft are being modified to make use of electrical power. These electrically powered systems require complex electronics, including power converters to transform power from generators to the correct loads. Power converters generate heat. Furthermore, in the environment of aircraft engines, ambient temperatures can be higher than in non-aerospace applications. Therefore, thermal management of the power converters is important.

Typically, power converters are mounted to heat sinks. The heat generated by the converter is transferred to a cooling fluid by the heat sink, and the cooling fluid can be carried away, in a fluid circulation system.

According to a first aspect there is provided a thermal management device for dissipating heat from one or more electrical components in an aircraft, the thermal management device including: a heat spreader comprising a plurality of layers of annealed pyrolytic graphite, the heat spreader having higher thermal conductivity in a plane defined by the layers than in a direction perpendicular to the layers; a flow path for a cooling fluid defined through the heat spreader, such that at least a portion of the flow path is surrounded by the heat spreader, wherein the flow path is helical, around a central axis extending through the plurality of layers; and a housing encasing the heat spreader, the housing arranged to have one or more electrical components mounted there-on and to form a thermal interface between the heat spreader and one or more electrical components.

The thermal management device provides for an efficient, lightweight and compact system for dissipating heat from electrical components, making it ideal for use in aircraft. In particular, the annealed pyrolytic graphite is lightweight and has high thermal conductivity, and the helical flow path also has a high thermal conductivity, providing for efficient heat transfer in a compact design. The helical flow path also creates turbulence in the cooling fluid from the path of the fluid itself, rather than action being done on the fluid. This further improves the efficiency of the heat transfer. The use of a helical flow path, in combination with the spreader provides high levels of heat transfer, even for cooling fluids with low thermal conductivity, such as aero-lubricant and aviation fuel.

The cooling fluid may comprise aero-lubricant or aviation fuel. By using aero-lubricant or aviation fuel as a cooling fluid, the device makes use of fluids already available in an aviation environment. Therefore, a separate supply of cooling fluid is not required, providing further weight savings. Furthermore, aviation fuel may require heating during operation of the aircraft, and so using the aviation fuel to carry heat from electrical components can provide this heating, reducing the need for extra heating components.

The flow path may contact an internal surface of the housing at a plurality of points along the flow path. This further increases heat transfer to the cooling fluid.

The thermal management device may include recesses in an outer surface of the housing, where the thickness of the housing is reduced. The recesses may align with at least some of the contact points between the flow path and the housing. The recesses provide for further thermal conductance form the electrical components to the cooling fluid.

The flow path may be defined by a pipe carrying the cooling fluid passing through the housing. The material of the pipe may be used as a thermal via to help dissipate heat through the spreader. The pipe may extend outside the housing, and portions of the pipe outside the housing may be arranged for mounting the thermal management device to a cooling fluid and/or electrical system including the device. By using the pipe carrying cooling fluid to mount the device, the need for additional support structures is reduced, providing further weight savings.

The pipe may be helical in shape, and the flow path may be defined inside the pipe. Alternatively, the pipe may extend straight, and the thermal management device may further comprise: a helical baffle arranged on the exterior of the pipe; a void formed in the heat spreader around the pipe and baffle; and slots formed in a section of the pipe within the housing, to provide fluid communication between the interior of the pipe and the void, wherein the flow path is defined on the exterior of the pipe, by the baffles.

The housing may comprise a plurality of faces, and at least two of the faces may be arranged to have one or more electrical components mounted thereon. Having components mounted on multiple faces of the housing provides for space saving, since the cooling fluid flows concentrically with the components, and so more components can be mounted on a single device.

The housing may comprise an elongate cuboid having four elongate sides arranged around the axial direction of the device, wherein each of the elongate sides may be arranged to have one or more electrical components mounted thereon. This also allows for increased power density of the system.

The thermal management device may include: an inlet in the housing for providing cooling fluid into the flow path; and an outlet in the housing for exhaust cooling fluid form the flow path. The fluid may flow from the inlet to the outlet. The device is single pass, meaning that fluid flows in one end of the device, and passes to the other end, where is passes out. This enables the inlet and outlet to be used for mounting the device.

The flow path may be arranged along a path axis extending from the inlet to the outlet, and the path axis may extend through the plurality of layers of the heat spreader. This means the flow path extends perpendicular to the layers of the annealed pyrolytic graphite, and so the heat transfer to the cooling fluid is improved.

The housing may encapsulate the heat spreader. This provides improved thermal transfer, and structural strength to the spreader.

One or more of the following parameters may be varied to optimise the cooling characteristics of the device: the diameter of the helical flow path; and/or the pitch of the helical flow path; and/or the number of revolutions in the helical flow path and/or the pipe diameter and/or the pipe wall thickness.

According to a second aspect, there is provided a power converter including: one or more electrical components mounted on the thermal management device of the first aspect.

By using the thermal management device of the first aspect, the power converter is efficient, lightweight and compact system for dissipating heat from electrical components, making it ideal for use in aircraft.

The electrical components may be mounted on two or more faces of the thermal management device. This saves space and reduces requirements for additional heat sinks, saving weight.

The electrical components may include one or more of: power modules; switches; capacitors; filters; gate drivers; bus bars; sensors and the like.

The electrical components may be mounted concentrically around the thermal management device. This provides for further space and weight savings, whilst still providing efficient cooling.

When using aero-lubricant or aviation fuel as the cooling fluid and a helical pipe to define the flow path, the flow path may have a helix diameter of 43.18 mm; and/or the pipe may have a diameter of 19.05 mm; and/or the pipe may have a wall thickness of 1.78 mm; and/or the flow path helix has a pitch of 33.02 mm; and/or the helical flow path has seven complete revolutions.

The skilled person will appreciate that except where mutually exclusive, a feature described in relation to any one of the above aspects may be applied mutatis mutandis to any other aspect. Furthermore, except where mutually exclusive any feature described herein may be applied to any aspect and/or combined with any other feature described herein.

Embodiments will now be described by way of example only, with reference to the Figures, in which:

FIG. 2A illustrates a side view of the pipe from the thermal management device of FIG. 1A;

Figure 1A:
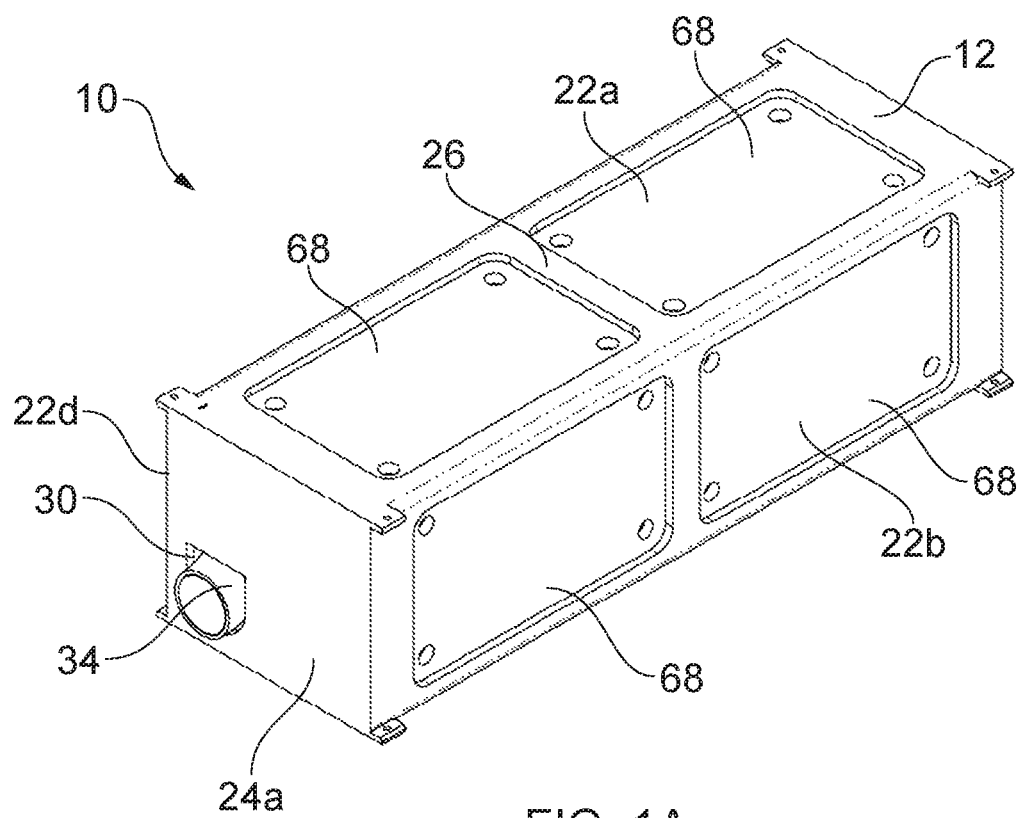
FIG. 1A is a perspective view of a thermal management device according to an embodiment of the disclosure.
Figure 3A:
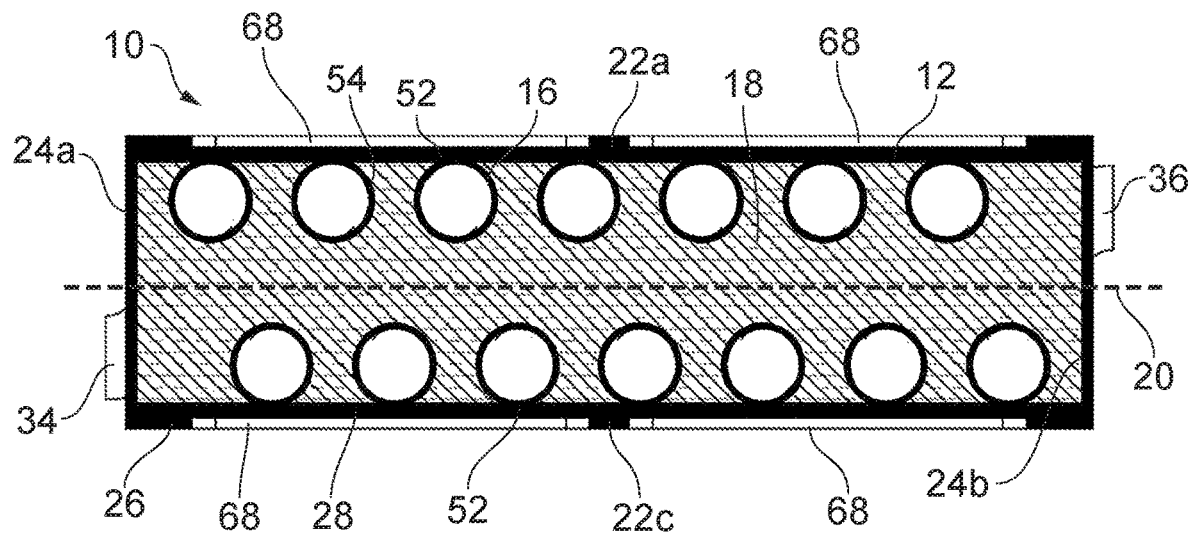
Figure 3B:
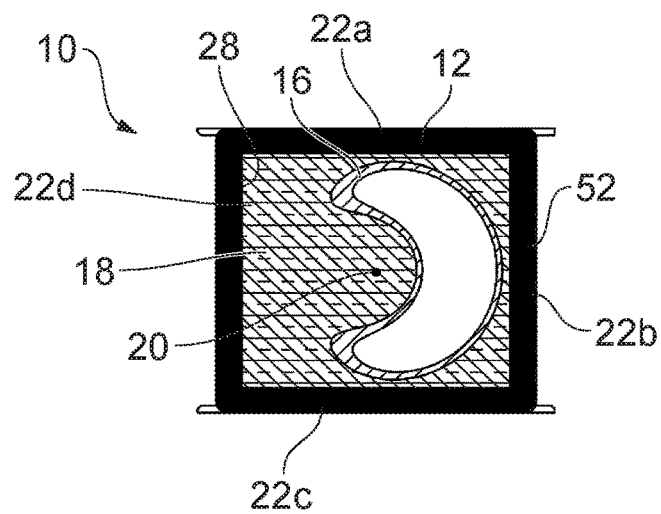
Figure 4A:
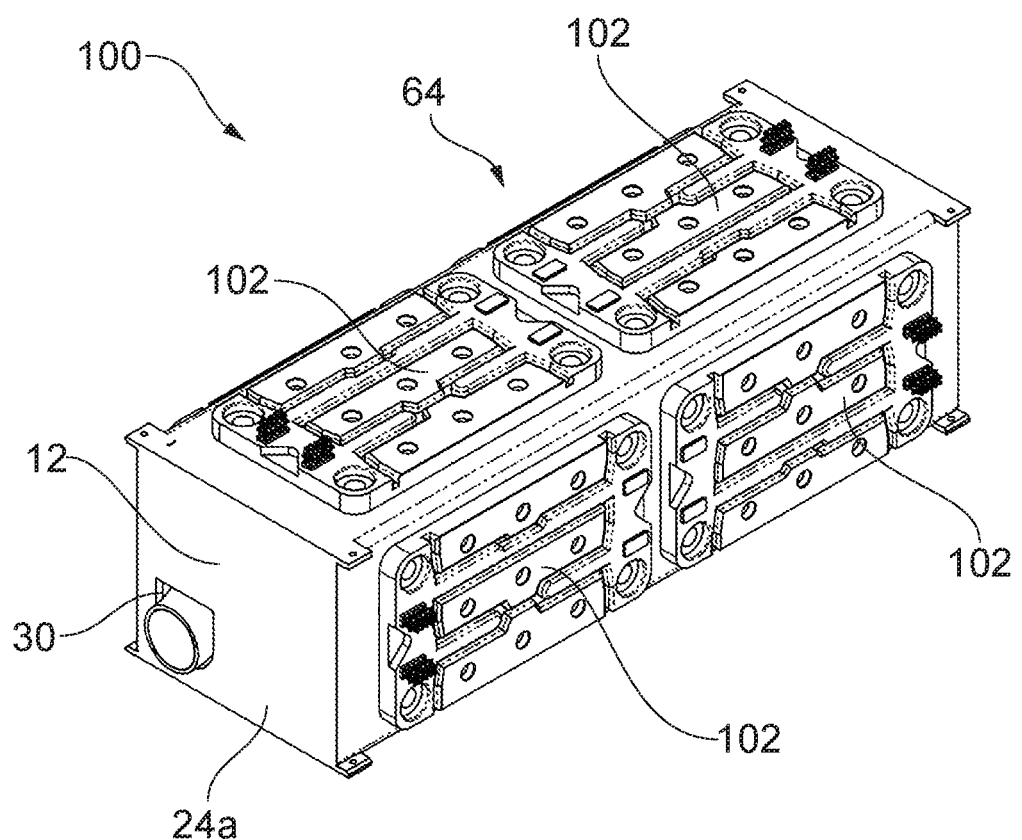
Figure 4B:
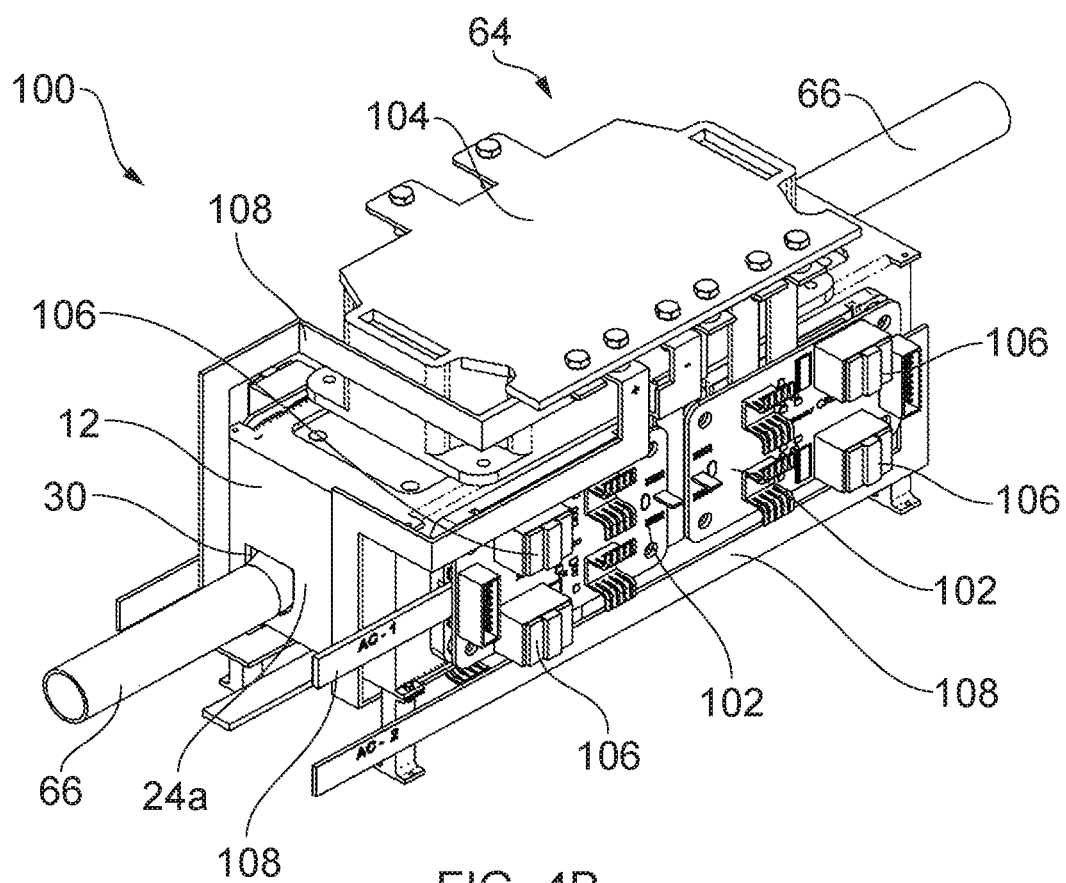
Figure 5:
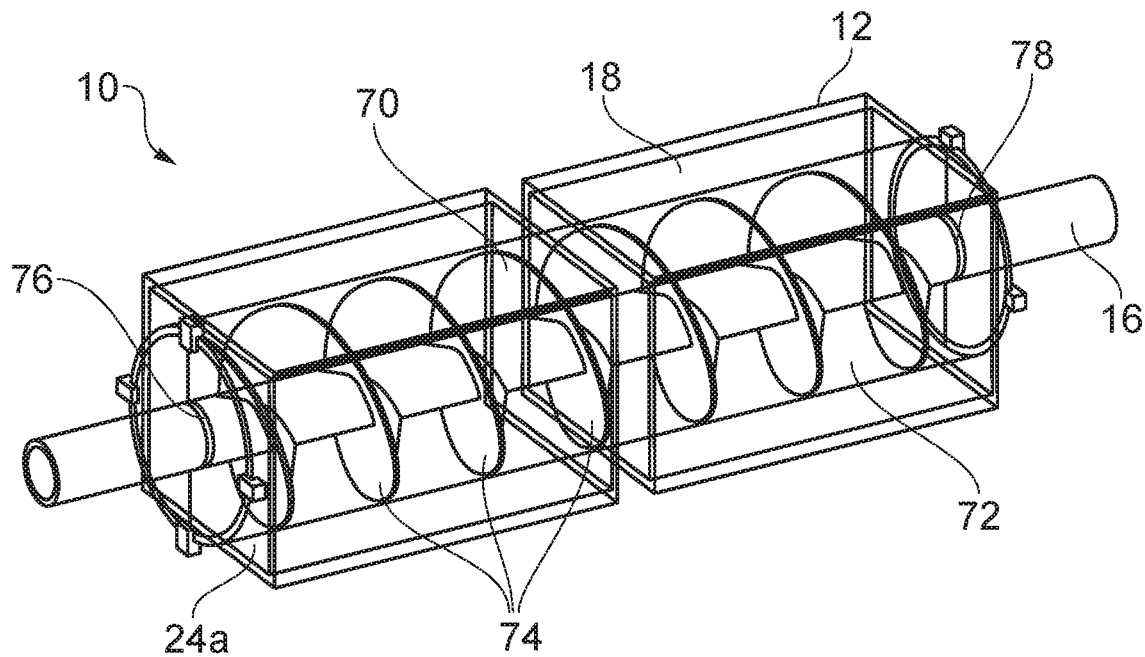

FIG. 2B schematically illustrates an end on view of the pipe of FIG. 2A;

FIG. 3A illustrates a sectional view along the length of the thermal management device of FIG. 1A;

FIG. 3B illustrates a sectional view across the width of the thermal management device of FIG. 1A;

FIG. 4A illustrates an example embodiment of the device with electrical components mounted thereon;

FIG. 4B illustrates an example embodiment of the device with electrical components mounted thereon; and FIG. 5 illustrates a thermal management device according to an alternative embodiment of the disclosure.

The Figures illustrate an example embodiment of a thermal management device 10. In the example shown, the device 10 includes a housing 12 defining an interior volume 14, with a helical pipe 16 passing through the housing 12. The space in the volume 14 between the pipe 16 and housing 12 is filled with an annealed pyrolytic graphite (APG) filler 18.

The housing 12 is a cuboid shape, elongated along an axis 20 defining the axial direction of the device 10. The housing 12 has elongate side faces 22a-d extending along the axis 20, with end faces 24a,b formed perpendicular to the sides 22a-d and axis 20. Each of the faces 22a-d, 24a-b is formed by a wall having an exterior surface 26 and an interior surface 28. The interior surfaces 28 of the faces 22a-d, 24a-b defines the volume 14 within the hollow housing 12.

Figure 1B:
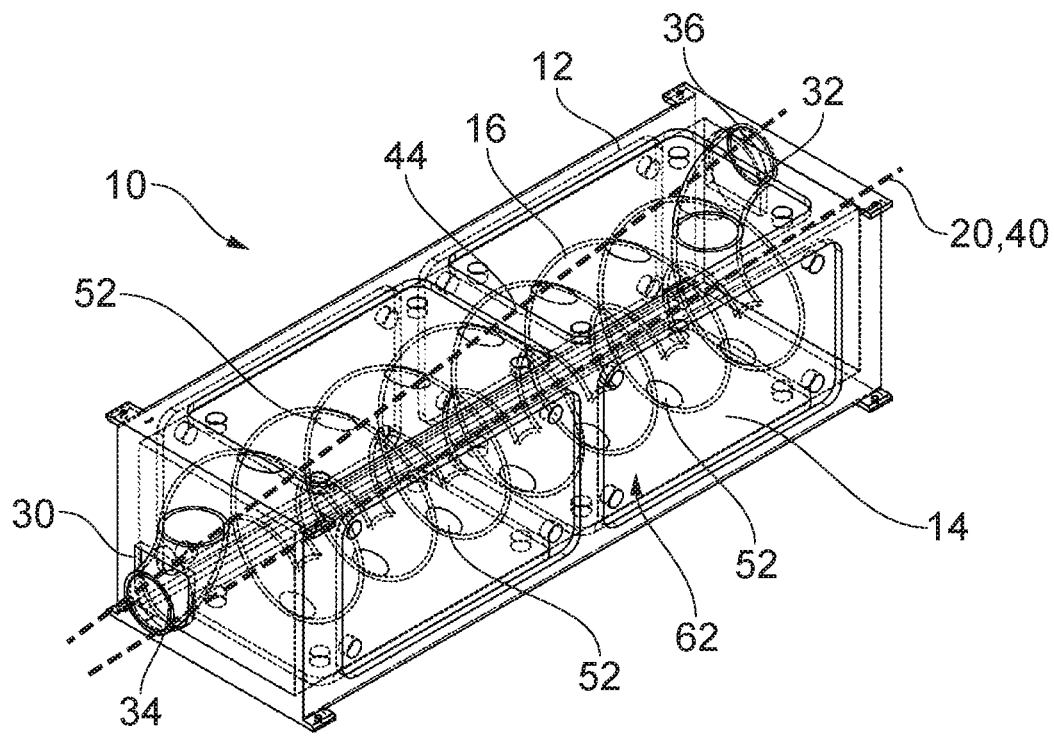
FIG. 1B is a perspective view of the thermal management of FIG. 1A, in which the outer housing is transparent.

As best shown in FIG. 1B, in which the housing 12 and APG filler 18 are made transparent for illustrative purposes, an inlet aperture 30 is provided in a first of the end faces 24a, and an outlet aperture 32 is provided in the opposing end face 24b. The pipe 16 passes into the volume 14 through the inlet 30, and passes out through the outlet 32. Between the inlet 30 and the outlet 32, the pipe 16 follows a helical path.

The interior surface 28 of the housing 12 is smooth. However, the exterior surface 26 includes a number of recessed indents 68 formed in the elongate faces 22a-d, where the thickness of the housing wall is reduced. In the example shown, each elongate face 22a-d includes two rectangular recesses 68 along the length of the device 10, however, any suitable arrangement of recesses 68 may be provided.

FIGS. 2A and 2B show the pipe 16 of the embodiment shown in FIGS. 1A and 1B in more detail. An inlet region 34 and an outlet region 36 of the pipe 16, which pass through the inlet aperture 30 and outlet aperture 32 respectively, extend straight at either end. Between these regions 34, 36, a helical region 38 of the pipe 16 is formed, in which the pipe 16 follows a clockwise path spiral path.

FIG. 2B schematically shows the pipe 16 end on. The helical path is formed around a central axis 40 of the helix. The pipe 16 follows a circumferential path around the axis 40, at a fixed radius from the axis 40. To form the helical path, the pipe also moves axially along the axis 40 as well as circumferentially around it, forming revolutions 42. Within the helical region 38, the pipe 16 completes a number of complete revolutions 42. A single revolution is considered to be where the pipe 16 travels a full 360° path around the axis 40.

The helical path may be characterised by the diameter 46 and pitch 48 of the helix and the number of complete revolutions. The diameter 46 is the internal diameter down the centre of the helix (i.e. the diameter of the largest cylinder that could be fitted along the helix axis 40). The pitch 48 is the axial length over which a complete revolution 42 is completed. In the example shown, the radial position of the pipe 16 remains unchanged along the length of the helical region 38, and so the helix has constant diameter 46 along its length.

As shown in FIGS. 2A and 2B, the inlet region 34 and outlet region 36 are offset from the helix axis 40, and are arranged at the circumference defined by the helical region 38. As shown in FIG. 1B, and FIGS. 2A and 2B, the inlet region 34 and outlet region 36 may also be offset from each other at any position around the circumference of the axis 40. This means that there may be short sections of pipe 16 which do not form complete revolutions, within the inlet and outlet regions 34, 36.

A straight line between the inlet and outlet regions 34, 36 defines an axis 44 of the flow path of fluid flowing from the inlet region 34 to the outlet region 36. This is the general direction in which the fluid flows, although, as shown in FIGS. 1B, 2A and 2B, the flow path does not exactly follow this axis 44

Referring to FIG. 1B, in the assembled device 10, it can be seen that the axial direction 20 of the device and the central axis 40 of the helix are parallel. In the example shown, the path axis 44 is not parallel to the device axis 20 and helix axis 40, as a result of the circumferential offset of the inlet region 34 and the outlet region 36. This means that the path axis 44 forms an angle with the device axis 20 and helix axis 40. However, the path axis is still considered to be substantially parallel to the device axis 20 and helix axis 40, because the path axis 44 passes through the end faces 24a-b of the housing 12, and so the path still follows the same general direction as the device 10.

The pipe 16 is formed of an annular wall 54 defining an inner surface 56 of the pipe 16 (shown by the dashed line in FIG. 2A), and an outer surface 58. The pipe wall 54 has a thickness 60 between the inner wall 56 and the outer wall 58.

Again referring to FIG. 2B, the diameter 50 of the pipe 16 (measured inside the pipe), the thickness 60 of the pipe 16, the diameter 46 of the helix and the size of the housing 12 in the two directions perpendicular to the axial direction 20 of the device 10 are such that peripheral edges of the revolutions 42 contact the internal surface 28 of the housing 12 at contact regions 52. Contact regions 52 are formed on all elongate faces 22a-d, along the length of the device 10, and aligned with the recessed indents 68 in the housing 12. Four contact regions 52 are formed per revolution 40 (only two per revolution shown, for clarity).

FIGS. 3A and 3B show the filler 18 in more detail. FIG. 3A shows a cross section taken parallel to the axial direction 20 of the device 10 and FIG. 3B shows a cross section perpendicular to the axial direction 20 of the device 10.

As discussed above, the filler 18 is formed of APG. APG is a material that has a layered, planar structure. APG has high thermal conductivity along the plane of the layers, but low thermal conductivity between layers.

The filler 18 is arranged so that the layers of the APG are parallel to the end faces 24a-b of the housing, and the device axis 20 is perpendicular to the layers. Therefore, as shown in FIG. 1B, the axial direction 20 of the device and the central axis 40 of the helix extend perpendicular through the layers, whilst the path axis 44 extends through the layers, without being exactly perpendicular.

As shown in FIGS. 3A and 3B, the APG filler 18 occupies the space between the housing 12, and the pipe 16, providing continuous thermal contact form the housing 12 to the pipe 16. Therefore, the portion 62 of the pipe 16 within the housing 12 is surrounded by the filler 18. The housing 12 also encapsulates the APG filler 18, such that the filler 18 retains its shape.

The housing 12 is made of a thermally conductive material, such as aluminium or copper, and acts as a thermal interface between the electrical components 64, which generate heat, and a heat sink 66 formed by the pipe 16 and filler 18. The APG filler 18 acts as a heat spreader to distribute the heat throughout the device (in the plane of the layers of APG), to the cooling fluid carried in the pipe 16.

The pipe 16 is also made of a thermally conductive material, such as aluminium or copper, and therefore the pipe acts as a thermal via to enable heat to be transmitted between the layers of APG. In the regions 52 where the pipe 16 contacts the housing 12, this further acts as a thermal via for distributing heat direct from the heat generating electrical components 64.

In use, a cooling fluid is passed through the pipe 16. The fluid may be pumped, and may be provided as part of a wider cooling or fluid delivery system.

Heat is transferred to the fluid in the pipe 16 as discussed above The fluid is carried away along the flow path through the pipe 16, dissipating the heat generated. Since the fluid passes along the pipe 16 from the inlet 30 at one end to the outlet 32 at the other end, and is always passing in this direction without ever doubling back towards the inlet 30, the heat sink is a single pass heat exchanger.

The pipe 16 extends further beyond the inlet aperture 30 and outlet aperture 32. These sections 66 of the pipe 16 can be used to couple the device 10 to a wider cooling fluid system. Furthermore, since the device 10 is single pass, and the external sections 66 of the pipe 16 are at opposite ends of the device 10, the external sections of pipe 66 can be used to mount the device within the wider system, removing the need for additional support structures.

Any suitable cooling fluid may be used. In embodiments of the device used in aviation environments, aero-lubricant and aviation fuel are available as cooling fluids. These materials have low thermal conductivity and high kinematic viscosity. For example, at room temperature, lubricating oil has thermal conductivity of 0.1-0.2 W/mK and kinematic viscosity up to between 50 to 70 mm$^2$/s. The device parameters can be optimised for use of these fluids, to provide low thermal resistance and low pressure drops, and low thermal resistance, as discussed below.

In some examples, the thermal management device 10 may be used to pre-heat the aviation fuel before it is provided for combustion.

FIGS. 4A and 4B show an example an electrical device 100 formed around the thermal management device discussed above. The example shown in FIGS. 4A and 4B is a power converter 100.

FIG. 4A shows only the power modules 102 of the power converter 100. The power modules 102 include several semiconductor components (not shown) assembled into the required circuit for achieving power conversion. The components are mounted on a substrate (not shown), and packaged into a single module 102, which is mounted within the recesses 68 on formed the elongate faces 22a-d of the housing 12. As shown in FIG. 4B, further ancillary components required for power conversion, such as capacitor assemblies 104, gate drivers 106 and bus bars 108 for allowing conduction between the components may also be mounted, outside the power modules 102. In this way, the components 64 can be mounted concentrically around a heat sink, with the components generating the most heat closest to the heat sink.

In this example, the heat output of the power converter 100 is approximately 1 to 2 kW and the cooling fluid used is aero-lubricant. The housing 12 and pipe 16 are made of aluminium and copper respectively. The helical region 38 of the pipe has a helix diameter 46 of 43.18 mm, the pipe 16 has a diameter 50 of 19.05 mm, the wall 54 of the pipe 9 is 1.78 mm thick, the pitch 48 of the helix is 33.02 mm and the helix includes seven revolutions 42. The housing 12 has a length of 230 mm, with breadth and width both 85 mm. The thickness of the housing wall is 6.35 mm. In such an example, the pressure drop may be as low as 4.5 kPa, meaning that more viscous fluids may be used. Based on these parameters, the thermal resistance of the device may be as low as 0.025° C./W FIG. 5 illustrates an alternative embodiment of the thermal management device 10. Unless stated otherwise, the features of the second embodiment or the same as the first.

In the example shown in FIG. 5, the pipe 16 passes into the housing through the inlet aperture 30, and out through the outlet aperture 32. However, in this embodiment, the pipe 16 extends straight between the end faces 24a-b of the housing 12. A helical baffle 70 is formed on the exterior of the pipe, within a cylindrical void 72 formed within the APG filler 18. The baffle 70 includes a number of turns 74. The void 72 is sized to fit the baffle 70, such that the APG filler material contacts the edges of the baffle 70.

An inlet slot 76 is formed in the pipe 16 inside the housing 12, near the first end 24a, before the first turn 74 of the helical baffle 70. An outlet slot 78 is formed in the pipe 16 inside the housing 12, near the second end 24b, after the last turn 74 of the baffle 70.

In use, the cooling fluid flows into the housing 12, through the pipe 16. The fluid then flows through the inlet slot 78, into the void 72. The cooling fluid travels along a helical flow path defined on the exterior of the pipe 16, by the baffle and the APG filler material 18, before flowing back into the pipe 16 through the outlet slot 78.

In this embodiment, the helical flow path is characterised by the diameter of the helical baffle 70 (also the diameter of the void 72), the pitch of the helical baffle 70, the number of revolutions completed by the helical baffle 70 and the thickness of the material of the helical baffle 70. The helical baffle 70 can be made of any suitable material, such as copper or aluminium.

In the example shown in FIG. 5, the flow path does not contact the housing 12. However, in other examples, the baffle may define the flow path such that the flow path does contact the interior surface of the housing.

The embodiments discussed above are given by way of example only. For example, features such as the indents 68 in the housing 12, and the contact regions 52 are optional and may be omitted. Furthermore, where necessary, additional support structures can be implemented to mount the device 10 to a wider cooling and/or electrical system (not shown).

Although the example discussed above shows a cuboid housing 12, the housing 12 may have any shape, with any number of faces, and with electrical components 64 mounted on any of the faces.

In the example discussed above, the helical flow path is defined by within a helical pipe 16 or outside a straight pipe 16, by a helical baffle 70. However, the helical flow path may be defined in any suitable manner.

Furthermore, in the example discussed above, the helical flow path is a simple helix with constant diameter and pitch along the length of the path, and with a straight central axis 40 along the length of the path. However, in other embodiments, the helical flow path may have any suitable shape that achieves the desired flow characteristics, turbulence and low pressure drop, and the contact regions 52 with the housing 12, if present.

For example, the diameter and/or pitch and/or central axis may vary along the length of the path. The variation in diameter may be such that the path gradually widens or narrows along its length (such that the helix is conical), or the width of the path may both increase and decrease along the length. Similarly, the pitch may gradually increase over the length, gradually decrease over the length, or both increase and decrease over the length. Furthermore, the central axis 40 around which the pipe 16 is formed may also follow any desired path. As such, any spiraled path may be considered to be a helical flow path.

The specific design of power converter 100 discuss above is given by way of example only. Other suitable materials and design parameters may be used to achieve desired heat transfer characteristics. Furthermore, although FIGS. 4A and 4B illustrate a power converter 100 and associated components, it will be appreciated that any suitable components may be mounted on the thermal management device 10.

The dimensions of the housing 12 and pipe 16 may be optimised for the dimensions and cooling requirements of the electrical components 64 used, the thermal characteristics of the cooling fluid use, the available pumping power, and the mechanical properties and size of the APG filler 18. Furthermore, the recesses 68 may be sized and shaped to receive any suitable component 64.

Typically, if the length of the housing 12 (or the axial length of the helical flow path) or the diameter of the pipe 16 is changed, the other parameters of the device are modified accordingly. Furthermore, the device parameters may be changed based on the available pumping requirements. The length of the housing 12 and helical flow path may be optimized based on the heat dissipation requirements for the power modules 102. Furthermore, different power modules 102 may have different sizes and surface areas, which can also be taken into account.

In general, the overall size of the device 10 may be up to 450 mm in length and 300 mm in width whilst obtaining a thermal resistance of between approximately 0.005° C./W and 0.025° C./W (with a cooling fluid flow rate of 7 lpm and 1 kW loss from the electrical components 64), when using aero-lubricant or aviation fuel.

In the examples discussed above, the axial direction 20 of the device 10 and the central axis 40 of the helix extend parallel to each other and perpendicular to the layers of the APG filler 18 (and hence the end walls 24a-b of the housing 12). The path axis 44 also extends through the layers of the APG filler 18, although non-parallel. However, in other examples, the three axes may all extend parallel or non-parallel to each other, whilst passing through the plane defined by the layers of the APG (or the planes defined by the end walls 24a-b). Furthermore, in other examples, the layers of the APG may not extend fully parallel to the end walls 24a-b of the device 10.

It will be understood that the invention is not limited to the embodiments above-described and various modifications and improvements can be made without departing from the concepts herein. Except where mutually exclusive, any of the features may be employed separately or in combination with any other features and the disclosure extends to and includes all combinations and sub-combinations of one or more features described herein.

The invention claimed is:

1. A thermal management device for dissipating heat from one or more electrical components in an aircraft, the thermal management device including:
    a heat spreader comprising a plurality of layers of annealed pyrolytic graphite, the heat spreader having higher thermal conductivity in a plane defined by the layers than in a direction perpendicular to the layers;
    a flow path for a cooling fluid defined through the heat spreader, such that at least a portion of the flow path is surrounded by the heat spreader, wherein the flow path is helical, around a central axis extending through the plurality of layers; and
    a housing encasing the heat spreader, the housing arranged to have the one or more electrical components mounted there-on and to form a thermal interface between the heat spreader and the one or more electrical components,
    wherein a pipe extends straight through the housing, and wherein the thermal management device further comprises:
    a static helical baffle arranged on the exterior of the pipe;
    a void formed in the heat spreader around the pipe and baffle; and
    slots formed in a section of the pipe within the housing, to provide fluid communication between the interior of the pipe and the void,
    wherein the flow path is defined on the exterior of the pipe, by the baffles.

2. The thermal management device of claim 1, wherein the cooling fluid comprises aero-lubricant or aviation fuel.

3. The thermal management device of claim 1, wherein the flow path contacts an internal surface of the housing at a plurality of points along the flow path.

4. The thermal management device of claim 3, including recesses in an outer surface of the housing, where the thickness of the housing is reduced, wherein the recesses align with at least some of the contact points between the flow path and the housing.

5. The thermal management device of claim 1, wherein the flow path is defined by the pipe carrying the cooling fluid passing through the housing.

6. The thermal management device of claim 5, wherein the pipe extends outside the housing, and wherein portions of the pipe outside the housing are arranged for mounting the thermal management device to a cooling fluid and/or electrical system including the thermal management device.

7. The thermal management device of claim 5, wherein the pipe is helical in shape, and the flow path is defined inside the pipe.

8. The thermal management device of claim 1, wherein the housing comprises a plurality of faces, and at least two of the faces are arranged to have the one or more electrical components mounted thereon.

9. The thermal management device of claim 8, wherein the housing comprises an elongate cuboid having four elongate sides arranged around the axial direction of the device,
wherein each of the elongate sides is arranged to have one or more electrical components mounted thereon.

10. The thermal management device of claim 1, including:
an inlet in the housing for providing cooling fluid into the flow path; and
an outlet in the housing for exhaust cooling fluid form the flow path
wherein the fluid flows from the inlet to the outlet.

11. The thermal management device of claim 10, wherein the flow path is arranged along a path axis extending from the inlet to the outlet, and wherein the path axis extends through the plurality of layers of the heat spreader.

12. The thermal management device of claim 1, wherein the housing encapsulates the heat spreader.

13. A power converter including:
the one or more electrical components mounted on the thermal management device of claim 1.

14. The power converter of claim 13, wherein the housing of the thermal management device comprises a plurality of faces and the electrical components are mounted on two or more faces of the thermal management device.

15. The power converter of claim 13, wherein the electrical components include one or more of: power modules; switches; capacitors; filters; gate drivers; bus bars; and sensors.

16. The power converter of claim 13, wherein the electrical components are mounted concentrically around the thermal management device.

17. The power converter of claim 13 wherein the cooling fluid of the thermal management device comprises aerolubricant or aviation fuel, the flow path of the thermal management device is defined by and inside a helical pipe carrying the cooling fluid passing through the housing of the thermal management device, and the power converter has one or more of the following features:
wherein the flow path has helix has a diameter of 43.18 mm;
wherein the pipe has a diameter of 19.05 mm;
where the pipe has a wall thickness of 1.78 mm;
wherein the flow path helix has a pitch of 33.02 mm;
wherein the helix has seven complete revolutions.

* * * * *